United States Patent [19]

Kuehnle

[11] 4,294,678

[45] Oct. 13, 1981

[54] APPARATUS AND METHOD FOR PREVENTING CONTAMINATION OF SPUTTERING TARGETS

[75] Inventor: Manfred R. Kuehnle, New London, N.H.

[73] Assignee: Coulter Systems Corporation, Bedford, Mass.

[21] Appl. No.: 98,223

[22] Filed: Nov. 28, 1979

[51] Int. Cl.³ .............................................. C23C 15/00
[52] U.S. Cl. ................................ 204/192 R; 204/298
[58] Field of Search ........................... 204/192 R, 298

[56] References Cited

U.S. PATENT DOCUMENTS 3,827,966  8/1974  Needham ............................ 204/298
3,911,579 10/1975  Lane et al. ...................... 204/298 X
3,976,555  8/1976  Von Hartel ...................... 204/192 R

OTHER PUBLICATIONS

J. Vossen and W. Kern, Editors, *Thin Film Processes*, Academic Press, New York, 1978, pp. 31-42.
A. Buchman et al., "Contamination Free Sputtering", *IBM Technical Disclosure Bulletin*, vol. 15, No. 6, (Nov. 1972), p. 1818.

*Primary Examiner*—Delbert E. Gantz
*Assistant Examiner*—William Leader
*Attorney, Agent, or Firm*—Silverman, Cass & Singer, Ltd.

[57] ABSTRACT

A sputtering apparatus which includes a vessel that is designed to be evacuated and sealed from the ambient atmosphere during its use in sputtering target material from targets that are mounted to be exposed to the interior of the vessel is provided with a shutter system that isolates the exposed target surfaces from the interior of the vessel when the vessel is opened. In this way the target material is closed off from the ambient atmosphere which of necessity enters into the interior of the vessel when it is opened to be serviced.

Each target is recessed into a chamber which is formed in the wall of the vessel, the chamber having an entrance opening to the interior of the vessel and, when open, exposing the active target surfaces to the interior of the vessel. A remotely controlled shutter is slid across the entrance of the chamber to seal the same from the vessel interior when desired.

10 Claims, 4 Drawing Figures

APPARATUS AND METHOD FOR PREVENTING CONTAMINATION OF SPUTTERING TARGETS

BACKGROUND OF THE INVENTION

Sputtering apparatus of the type with which the invention is concerned generally comprises a vessel which is capable of being sealed from the ambient atmosphere so that it can be pumped down and background gas admitted thereto. Inside the vessel there are provided anode means and cathode means spaced apart by a sputtering gap. The target material which is to be sputtered is built into portions of the cathode means which face the anode and a substrate is moved over the anode to capture material which is driven out of the cathode means by the sputtering process.

In the sputtering process, after the vessel has been evacuated, a background gas in the form of a heavy inert gas such as argon is admitted. A high electric field, preferably an RF field of several thousand volts at a frequency of 13.56MH is applied across the gap between the anode and the cathode and this ionizes the inert gas. The heavy ions bombard the target and drive target material in the form of molecules or atoms out of the target, such particles flying across the intervening gap toward the anode and impinging against the substrate.

Cathode materials are often used which are reactive with oxygen. Thus, if a vessel is open to the ambient atmosphere for purposes of recharging, the cathode materials may very well be contaminated by the oxygen and thereby be rendered inefficient or even inoperative. Likewise, pollutants and moisture may enter during the period of time that the vessel is open and thereby contaminate the target.

The invention herein solves this problem by closing off the targets and sealing them when it is desired to open the vessel, thereby preventing contamination thereof.

SUMMARY OF THE INVENTION

In accordance with the invention, a shutter is provided which is moved across the entrance of a separate chamber to close off and seal that chamber from the interior of the vessel, the target being contained in the target chamber. When sealed by the shutter the target chamber may then have its atmosphere controlled by admitting an inert gas or by drawing a vacuum therein. The shutter may comprise a single flat plate which is slid in slots of the chamber walls to open and to close and seal a single chamber, or the shutter may comprise a flat strip having spaced windows which are in registry with each of several chamber openings when the chambers are opened, with the shutters being slid to present solid blocking portions in registry with each of the target chamber entrance openings simultaneously to close and seal the several target chambers. The shutter is remotely controlled by a driving device which reciprocates the shutter to open and close the chamber as desired.

DESCRIPTION OF THE PREFERRED EMBODIMENT

The invention is concerned with apparatus for preventing the contamination of sputtering targets and, as such, is associated with sputtering apparatus of the type in which there are target means and anode means between which the sputtering takes place.

Figure 1:
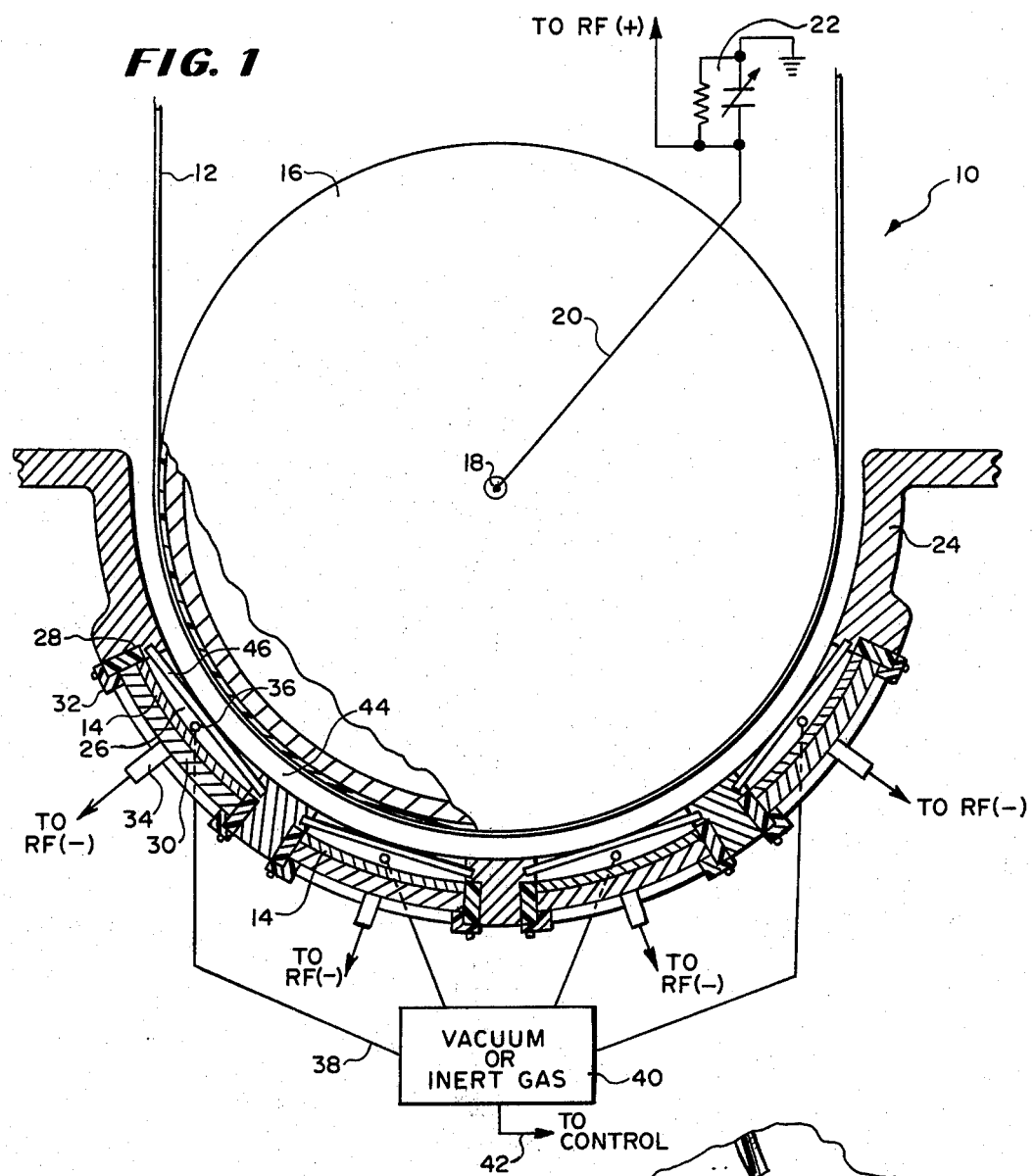
FIG. 1 is a fragmentary sectional view through a sputtering apparatus constructed in accordance with the invention.

FIG. 1 is a fragmentary view of the sputtering apparatus 10 constructed in accordance with the invention. The particular apparatus is of the type in which the substrate is a flexible web formed of some suitable material such as a polymer, paper or metal upon which it is desired to sputter the material contained in a plurality of targets 14, four of which are shown at the bottom of the view.

The anode 16 in this case is a large metal drum which may be insulatedly mounted on a suitable shaft 18, the shaft being connected to ground or to one terminal of a source of RF energy. The connection is indicated at 20 and there may be a by-pass to ground in the form of a tuned circuit such as shown at 22. This may provide a bias voltage on the anode 16.

The targets are all substantially the same; hence, the description of one and its mounting will suffice. The target 14 in this particular construction is arcuate and it is mounted in a target chamber 26 that is formed in a wall 24 and insulated therefrom by suitable insulating lining 28. The target 14 is mounted by welding or the like to a backing plate 30 whose rear surface is engaged by clamps 32 holding the assembly in place. Clamps 32 are insulating in character so that the target 14 and its backing plate 30 may be connected by a suitable terminal 34 to the negative terminal of the RF source as indicated.

Means are provided to introduce an inert gas or draw a vacuum in each of the target chambers 26, such means comprising a port 36 in each chamber 26 and a conduit 38 leading to a source 40 of the inert gas which may comprise, alternatively, means for drawing a vacuum. Control is effected by suitable means as indicated at 42.

In this type of apparatus, the substrate 12 may be fully contained within the vessel and it may have supply and take up reels therein.

The sputtering gap 44 between the targets and the anode 16 which, in this case, serves all of the targets, will have the substrate 12 passing therethrough in close engagement with the drum 16 which may rotate or be an idling drum. It is possible in certain instances for the anode 16 to be stationary and the substrate 12 to move over the anode by a sliding frictional engagement. Each of the target chambers is capable of being closed off by means of a shutter 46, the details of which are more clearly shown in FIG. 2.

Figure 2:
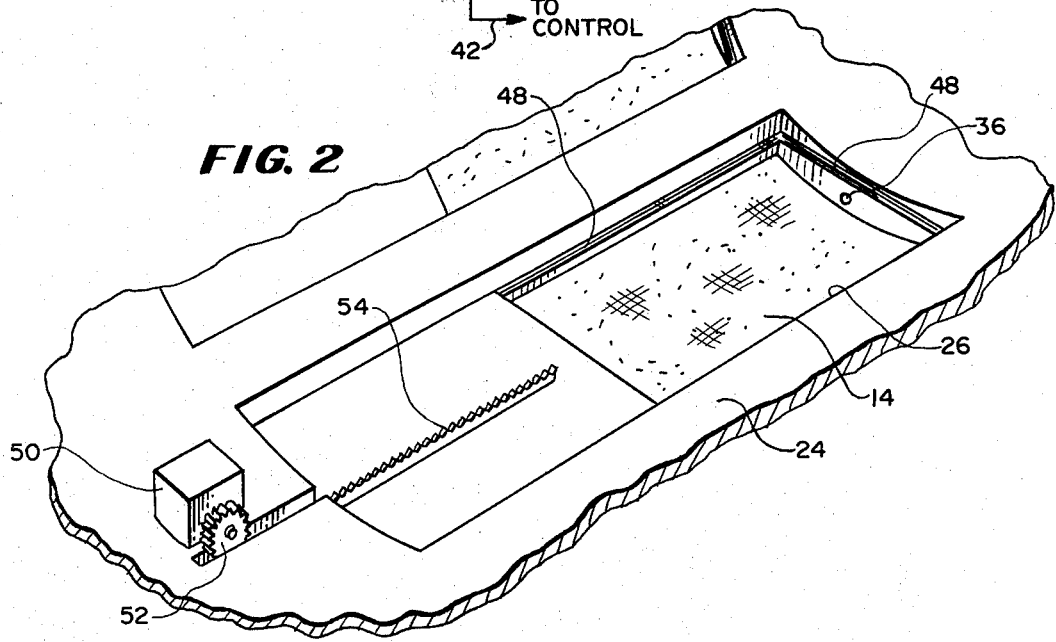
FIG. 2 is a fragmentary perspective view showing the manner in which the shutters are operated.

In FIG. 2, there is illustrated a target 14, which is mounted in the wall 24 in the chamber 26. The inner side walls of the chamber are provided with slots 48 that serve as tracks for a movable shutter 46 so that if the shutter is slid along the complete length of the chamber 26 it will close off the chamber entrance and seal the target from the inside of the vessel of the apparatus 10. A port is shown at 36 for admitting inert gas or drawing a vacuum in the chamber after the shutter 46 has been closed and sealed in place.

The shutter is to be operated remotely so that before the vessel is opened after a length of substrate 12 has been coated, the shutter may be closed. For this purpose, a motor is shown at 50 driving a pinion 52 which in turn engages a rack 54 that is carried on the outside of the shutter. Any other suitable mechanism may be used for closing the shutters when it is desired to open the vessel 10. Apparatus is likewise adaptable to the type of sputtering apparatus in which the substrate moves through the apparatus on a continuous basis.

Figure 3:
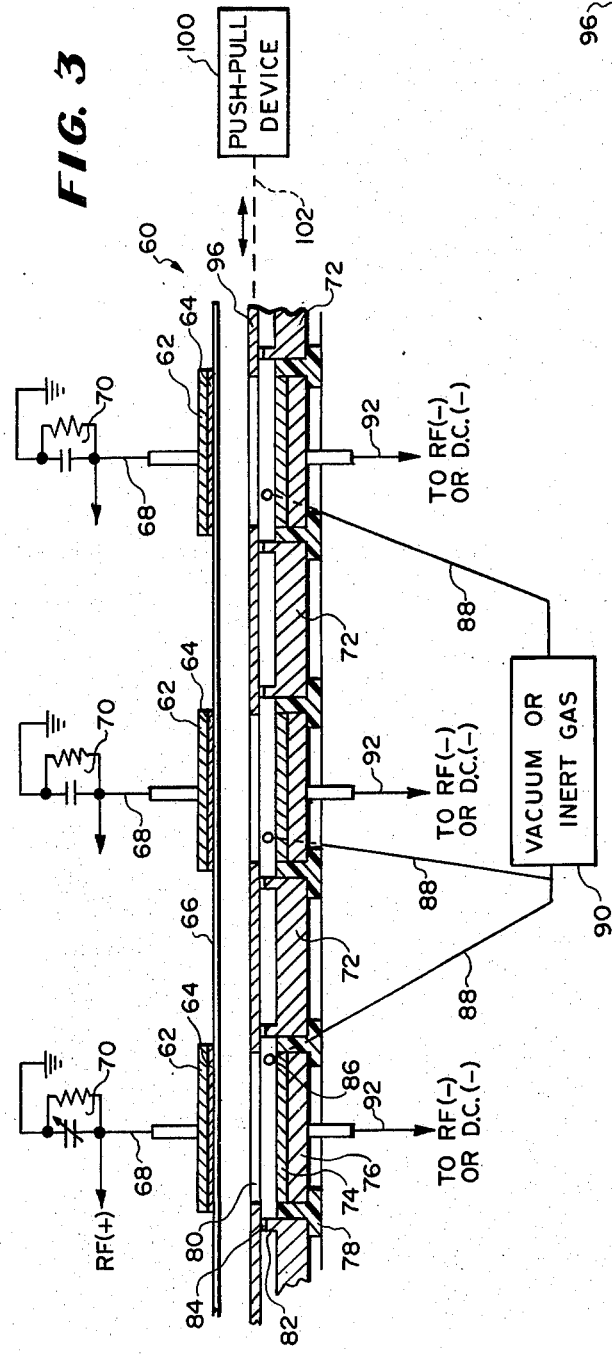
FIG. 3 is a fragmentary sectional view through a portion of sputtering apparatus of a different variety constructed in accordance with the invention and showing a modification thereof.
Figure 4:
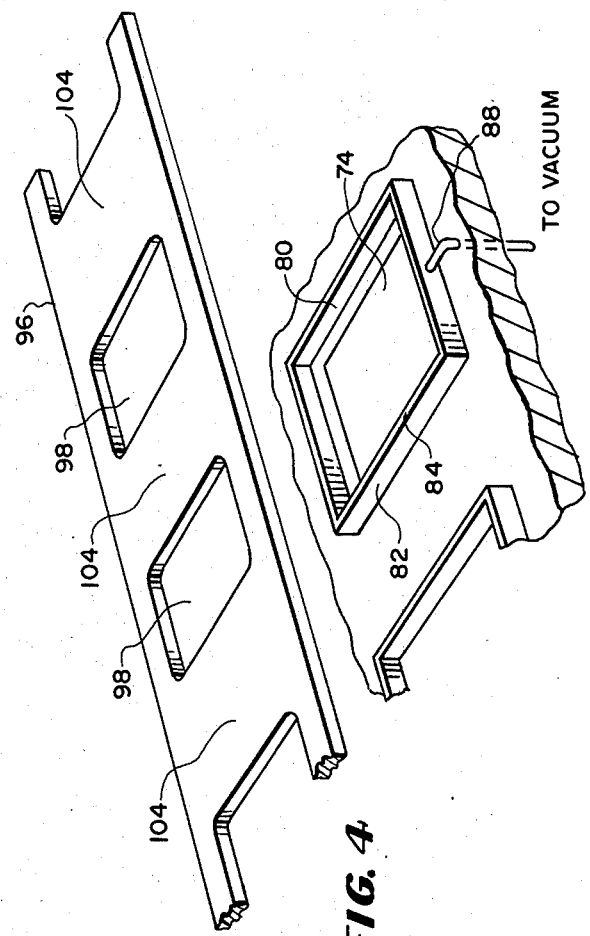
FIG. 4 is a fragmentary exploded view of a portion of the apparatus of FIG. 3.

In FIG. 3, there is illustrated a portion of an apparatus 60 in which the anodes 62 are in alignment along a path, each anode having an insulated face at 64 in case it is desired to sputter a metal substrate, the substrate itself being indicated at 66. Each anode is connected by way of the lead 68 to the RF source with a by-pass circuit being shown at 70. If desired for certain techniques, the connection 68 may extend directly to ground instead of being connected to an RF source.

In this case, the wall of the sputtering apparatus 60 is indicated at 72, the targets being indicated at 74, with their backing plates 76 mounted in the wall 72 by suitable insulating members 78. A target chamber 80 is formed by suitable rims or framing members 82 that may have gasketing materials 84 along the upper framing edges thereof. Again, as in the case of the apparatus 10, each target chamber 80 has a port 86 connected by suitable conduits 88 to a source of gas or means for drawing a vacuum as indicated at 90.

Each target is connected to RF or DC by suitable connections as indicated at 92, it being understood that in the case of DC, the targets will be at a negative polarity and the anodes will be at ground potential.

In order to close off the chambers 80 when it is desired to open the apparatus 60, a single shutter member 96 is provided, this shutter member having windows 98 which can align with the respective targets when the apparatus 60 is operating. By means of a suitable push-pull device 100 which is connected by suitable linkage 102 to the shutter member 96, the shutter member 96 may be moved by remote control. When the vessel of the apparatus 60 is opened, the blocking portions or shutter baffles 104 will be engaged against the insulating edges 84 of the framing members 82 and held tightly in place over the entrances of all target chambers to prevent contamination of the targets.

Variations may be made in the apparatus of the invention without departing from the spirit or scope of the invention as defined in the appendec claims.

What it is desired to secure by Letters Patent of the United States is:

1. In a sputtering apparatus which comprises a vessel including means for establishing low pressure gas conditions within the vessel and maintaining the interior of the vessel in sealed condition relative to the exterior ambient atmosphere, anode and cathode means within the vessel and the cathode means including at least one target material surface exposed to the interior of the vessel, the anode and cathode means being disposed in such a manner that said target material surface is in face to face relationship with the anode means and spaced therefrom whereby to enable a substrate member to be interposed in said space, means for extending electrical connections from said anode and cathode means to an exterior source of electrical energy, means for establishing and maintaining sputtering conditions within the vessel and means for maintaining a substrate member adjacent to the anode means in said space during the period of time that the sputtering conditions are being maintained within said vessel, the invention herein which comprises:

means for preventing contamination of the target material surface when the vessel is opened to the exterior ambient atmosphere comprising remotely controlled shutter means for selectively sealing off said target material surface from the interior of the vessel and exposing said target material surface to said interior of the vessel.

2. The invention as claimed in claim 1 in which said vessel has a recessed chamber in a wall thereof having an entrance between the chamber and the interior of the vessel, said cathode means are mounted in said chamber with the said target material surface aligned with the said entrance to face the interior of the vessel and said anode means through said entrance and in which said shutter means are adapted to block or open said entrance.

3. The invention as claimed in claim 1 in which the cathode means comprise a plurality of targets and the shutter means comprise a single shutter which is reciprocable to enclose or expose said targets substantially simultaneously.

4. The invention as claimed in claim 1 in which the cathode means comprise a plurality of targets and the shutter means comprise a plurality of shutters, each being associated with a respective target.

5. The invention as claimed in claim 1 in which said cathode means comprise a plurality of targets, the vessel has a plurality of recessed chambers in a wall thereof, each chamber having an entrance between said chamber and the interior of the vessel, each target being mounted within a respective chamber with its target material surface aligned with its chamber entrance and facing the interior of the vessel through said entrance and in which said shutter means comprise individual shutter baffles respectively mounted relative to the respective entrances for blocking or opening same.

6. The invention as claimed in claim 5 in which said baffles of the shutter means are independently operable.

7. The invention as claimed in claim 5 in which the shutter means comprise an elongate unitary member having alternate windows and said shutter baffles, the recessed chamber entrances being arranged along a line spaced from one another with the same spacing as the windows and shutter baffles so that a single reciprocatory movement of the elongate member by the distance of a window will either open or block all entrances.

8. The invention as claimed in claim 2 in which means are provided for producing atmospheric conditions within said recessed chamber independent of the atmospheric conditions in the vessel interior when the entrance is blocked.

9. The invention as claimed in claim 8 in which said last mentioned means comprise a port opening to said chamber and adapted to be connected with a source of gas that will not contaminate said target.

10. A method for operating a sputtering apparatus to prevent the contamination of the target means thereof, where said sputtering apparatus includes the target means and anode means on the interior of a sputtering vessel which is adapted to have sputtering conditions provided therein, which comprises blocking the target means from the atmosphere on the interior of the vessel before the vessel is opened to the ambient atmosphere, closing the vessel and pumping the air out of the same to start the sputtering process, unblocking the target means after the air has been pumped out and carrying on the sputtering process with the uncontaminated target means exposed.

* * * * *